US012313691B2

United States Patent
Jin et al.

(10) Patent No.: US 12,313,691 B2
(45) Date of Patent: May 27, 2025

(54) SYSTEM AND METHOD FOR BATTERY SELECTION

(71) Applicant: CPS Technology Holdings LLC, New York, NY (US)

(72) Inventors: Zhihong Jin, Pewaukee, WI (US); Michael Thomas Ballo, Glendale, WI (US); Zhenli Zhang, Glendale, WI (US); Diego Hernan Diaz Martinez, Milwaukee, WI (US); Raul Jacinto Arredondo Cardenas, Brookfield, WI (US)

(73) Assignee: CPS Technology Holdings LLC, New York, NY (US)

( * ) Notice: Subject to any disclaimer, the term of this patent is extended or adjusted under 35 U.S.C. 154(b) by 1123 days.

(21) Appl. No.: 17/048,995

(22) PCT Filed: Apr. 19, 2019

(86) PCT No.: PCT/US2019/028283
§ 371 (c)(1),
(2) Date: Oct. 20, 2020

(87) PCT Pub. No.: WO2019/204705
PCT Pub. Date: Oct. 24, 2019

(65) Prior Publication Data
US 2021/0239764 A1 Aug. 5, 2021

Related U.S. Application Data

(60) Provisional application No. 62/660,613, filed on Apr. 20, 2018.

(51) Int. Cl.
*G01R 31/392* (2019.01)
*B60L 58/16* (2019.01)
(Continued)

(52) U.S. Cl.
CPC ............ *G01R 31/392* (2019.01); *B60L 58/16* (2019.02); *G01R 31/007* (2013.01);
(Continued)

(58) Field of Classification Search
CPC .. G01R 31/392; G01R 31/007; G01R 31/367; G07C 5/0808; H01M 10/4285;
(Continued)

(56) References Cited

U.S. PATENT DOCUMENTS 7,076,350 B2 * 7/2006 Ivarez-Troncoso ......................... G05B 13/026
701/36
9,056,556 B1 6/2015 Hyde et al.
(Continued)

FOREIGN PATENT DOCUMENTS

CN 1913217 A 2/2007
CN 103033752 A * 4/2013
(Continued)

OTHER PUBLICATIONS

International Search Report and Written Opinion of the International Searching Authority dated Aug. 7, 2019 for PCT/US2019/028283 filed Apr. 19, 2019, 12 pages.
(Continued)

*Primary Examiner* — Mary Cheung
(74) *Attorney, Agent, or Firm* — Boardman & Clark LLP (57) ABSTRACT

Disclosed is a vehicle comprising a vehicle system having a system having a number of loads defining a load profile; a validated battery comprising one or more batteries which can fulfill the load profile; an integrated battery selected from the validated battery, the integrated battery selected for longevity relative to other batteries; wherein the validated battery is provided within the vehicle. Further disclosed is a battery longevity predictor comprising a plurality of battery (Continued)

factors; a plurality of electrical load factors; a plurality of cycling or crank data; an output; wherein the output comprises a battery longevity predictor based on the plurality of battery factors, plurality of vehicle loads, and the plurality of cycling or crank data.

30 Claims, 6 Drawing Sheets

(51) Int. Cl.
<table><tr><td>G01R 31/00</td><td>(2006.01)</td></tr><tr><td>G01R 31/367</td><td>(2019.01)</td></tr><tr><td>G07C 5/08</td><td>(2006.01)</td></tr><tr><td>H01M 10/42</td><td>(2006.01)</td></tr><tr><td>H01M 10/48</td><td>(2006.01)</td></tr><tr><td>B60K 6/28</td><td>(2007.10)</td></tr></table>

(52) U.S. Cl.
CPC ......... *G01R 31/367* (2019.01); *G07C 5/0808* (2013.01); *H01M 10/4285* (2013.01); *H01M 10/48* (2013.01); *B60K 6/28* (2013.01); *B60Y 2200/92* (2013.01); *H01M 10/486* (2013.01); *H01M 2220/20* (2013.01)

(58) Field of Classification Search
CPC ............... H01M 10/48; H01M 10/486; H01M 2220/20; B60L 58/16; B60L 2240/54; B60L 2250/18; B60L 53/80; B60L 58/18; B60L 50/60; B60K 6/28; B60Y 2200/92; Y02E 60/10; Y02T 10/7072; Y02T 10/70; Y02T 10/62; Y04S 10/126
See application file for complete search history.

(56) References Cited

U.S. PATENT DOCUMENTS

<table><tr><td>10,752,126 B1</td><td></td><td>8/2020</td><td>Zhang et al.</td></tr><tr><td>2002/0026252 A1</td><td></td><td>2/2002</td><td>Wruck et al.</td></tr><tr><td>2005/0062455 A1</td><td></td><td>3/2005</td><td>Stavely et al.</td></tr><tr><td>2005/0080641 A1</td><td></td><td>4/2005</td><td>Ronning et al.</td></tr><tr><td>2013/0041538 A1</td><td></td><td>2/2013</td><td>Jin et al.</td></tr><tr><td>2013/0097037 A1</td><td></td><td>4/2013</td><td>Gospodarek et al.</td></tr><tr><td>2013/0278270 A1</td><td></td><td>10/2013</td><td>Koch</td></tr><tr><td>2014/0217976 A1</td><td></td><td>8/2014</td><td>McGrath et al.</td></tr><tr><td>2014/0356656 A1</td><td>*</td><td>12/2014</td><td>Chen ................. H01M 10/6556<br>429/62</td></tr><tr><td>2015/0268285 A1</td><td></td><td>9/2015</td><td>Loftus et al.</td></tr><tr><td>2015/0360578 A1</td><td>*</td><td>12/2015</td><td>Duan ..................... B60L 58/12<br>340/455</td></tr><tr><td>2017/0108551 A1</td><td>*</td><td>4/2017</td><td>Aliyev ............... G01R 31/3865</td></tr><tr><td>2017/0225584 A1</td><td></td><td>8/2017</td><td>Jin et al.</td></tr><tr><td>2017/0229876 A1</td><td></td><td>8/2017</td><td>Jhunjhunwala</td></tr><tr><td>2022/0026252 A1</td><td></td><td>1/2022</td><td>Sudou et al.</td></tr></table>

FOREIGN PATENT DOCUMENTS

<table><tr><td>CN</td><td>104362725 A</td><td>*</td><td>2/2015</td><td></td></tr><tr><td>CN</td><td>104459553 A</td><td>*</td><td>3/2015</td><td></td></tr><tr><td>CN</td><td>104787029 A</td><td>*</td><td>7/2015</td><td>............. B60K 6/445</td></tr><tr><td>CN</td><td>105717456 A</td><td>*</td><td>6/2016</td><td></td></tr><tr><td>CN</td><td>105868942 A</td><td>*</td><td>8/2016</td><td>......... G06Q 10/0631</td></tr><tr><td>KR</td><td>2009043890 A</td><td>*</td><td>5/2009</td><td></td></tr><tr><td>WO</td><td>2019204705 A1</td><td></td><td>10/2019</td><td></td></tr></table>

OTHER PUBLICATIONS

International Preliminary Report on Patentability of the International Bureau of WIPO dated Oct. 20, 2020 for PCT/US2019/028283 filed Apr. 19, 2019, 7 pgs.

\* cited by examiner

FIG. 1

| States 237 | High Electrical Demand 203 | User Behavior 202 | Environment / Operate Within 200 |
|---|---|---|---|
| 1 |  |  |  |
| 2 |  |  | ✓ |
| 3 |  | ✓ | ✓ |
| 4 | ✓ | ✓ |  |
| 5 | ✓ |  |  |
| 6 | ✓ | ✓ | ✓ |
| 7 | ✓ | ✓ |  |

| | High Electrical Demand 203 | User Behavior 202 | Environment / Operate Within 200 |
|---|---|---|---|
| Influencing Factors 233 | OE on Board<br>AM Enhancement<br>Load Mgmt. Strategy | Driving Pattern<br>Plug Ins<br>Urban/Suburban/Rural | Temperature (Ambient and Under Hood)<br>Road Condition<br>Battery Placement |
| Application 235 | Diesel<br>Plow Truck<br>Mini Van<br>Luxury<br>Start/Stop | Milk Run<br>Road Warrior<br>Student<br>Avid Enthusiast<br>Traffic EQ | PR<br>Desert Environment<br>South USA<br>Without Heat Shield |

SYSTEM AND METHOD FOR BATTERY SELECTION

CROSS-REFERENCE TO RELATED APPLICATIONS

This application is a 371 national phase entry of international application, Serial Number PCT/US2019/028283 filed Apr. 19, 2019, which claims the benefit of and priority to U.S. Provisional Patent Application, Ser. No. 62/660,613 filed Apr. 20, 2018, the entire contents of each of which is hereby incorporated herein by reference.

FIELD

This application relates to the field of batteries and more particularly to automotive batteries.

BACKGROUND

The performance requirements of batteries have changed with evolving vehicle technologies. While previously batteries may have supported cranking and relatively limited internal vehicle electrical function (i.e. radio, air conditioning, lights, etc.), battery requirements have shifted over time.

For example, many recent vehicles are equipped with technology which shuts down the engine when the vehicle is at rest/stopped (for example, at a stoplight). This feature is known as "start-stop technology" and aims to reduce fuel consumption and idle emissions. In hybrid vehicles, the engine also shuts down, which may have the start-stop function fully integrated without the ability to be disabled. Typically, a vehicle will continue to provide internal functions (air conditioning/heat, radio, etc.) while the engine is turned off during a start-stop event. When the brake starts to be released or the clutch is starting to be engaged, the engine is restarted.

Further, as advanced systems and functionality become increasingly common, the likelihood of depending on the batteries is increased for more advanced and often safety-critical loads. For example, lane-assist and to a greater extent autonomous steering technology may require the vehicle system to provide consistent power to a steering module within the vehicle.

These and other evolving functionalities may create strain on the battery. Different batteries may be more suited to support these functionalities than others. Further, these functionalities and subsequent strain may contribute to changes in anticipated life of a battery within a vehicle. In other words, supporting these functionalities may impact battery life.

Current systems may not adequately predict battery life. Current systems may likewise may be inadequate at properly identifying a suitable battery.

SUMMARY

Accordingly, an improved system for selecting a battery is disclosed. The system and method may evaluate and provide a recommendation for the best battery for a particular vehicle, used in a particular way, in a particular environment. In other words, the disclosed may provide a battery recommendation based off the intended usage case as well as environmental factors of the vehicle. This recommendation will, in various embodiments, be backed by quantitative data outputted by a model where selection criteria will then be in place to select the proper battery. The system may be used in new vehicles (OEM setting) or in used vehicles (for example, in replacement batteries). In addition, it may be used in a single vehicle or in a group of vehicles—for example Zip Code ViO (Vehicle in Operation) Analysis (for IAM) or "All SUVs" (for an OE). The system may allow for better predictions for warranty purposes and performance characteristics. The system may also allow for comparison of battery performance, for example, among a range of battery technologies, product lines (including for example manufacturers, plants), and group sizes. The system may also be able to provide different usage cases and control strategy (how the OE manages alternator and battery) cases and their effect on the life of a particular battery (ex. Soccer Mom vs. Traveling Salesman vs. Off-Road Driver). The life of the particular battery may be given, in various embodiments, relative to the life of other batteries.

Disclosed according to various embodiments is a battery longevity predictor comprising: a plurality of battery factors; a plurality of electrical load factors; a plurality of cycling or crank data; an output; wherein the output comprises a battery longevity predictor based on the plurality of battery factors, plurality of vehicle loads, and the plurality of cycling or crank data. Further disclosed is a battery longevity predictor comprising a battery simulator having the plurality of battery factors, the plurality of vehicle loads, and/or the plurality of cycling or crank data. Further disclosed is a battery longevity predictor wherein the electrical load factors comprise driver factors. Further disclosed is a battery longevity predictor wherein the driver factors comprise driving patterns and driving context. Further disclosed is a battery longevity predictor wherein the electrical load factors comprise environmental factors. Further disclosed is a battery longevity predictor wherein the battery simulator comprises a vehicle simulation and performance analysis.

Disclosed herein according to various examples of embodiments is a vehicle comprising: a vehicle system having a system having a number of loads defining a load profile; a validated battery comprising one or more batteries which can fulfill the load profile; an integrated battery selected from the validated battery, the integrated battery selected for longevity relative to other batteries; wherein the validated battery is provided within the vehicle. Further disclosed is a vehicle system wherein the load profile comprises battery size. Further disclosed is a vehicle system wherein the load profile comprises environmental factors. Further disclosed is a vehicle system wherein the load profile comprises driver factors. Further disclosed is a vehicle system wherein the load profile comprises vehicle loads. Further disclosed is a vehicle system wherein longevity is evaluated relative to a number of factors, which may include Amp-hr throughput over time, average and peak current over time, state of charge over time, depth of discharge over time, and Fuel Economy.

Disclosed is a battery selector comprising: a plurality of battery factors; a plurality of electrical load factors; a plurality of cycling or crank data; an output; wherein the output comprises a battery selection based on the plurality of battery factors, plurality of vehicle loads, and the plurality of cycling or crank data. Further disclosed is a battery selector further comprising a battery simulator having the plurality of battery factors, the plurality of vehicle loads, and/or the plurality of cycling or crank data. Further disclosed is a battery selector wherein the electrical load factors comprise driver factors. Further disclosed is a battery selector wherein the driver factors comprise driving patterns and driving context. Further disclosed is a battery selector wherein the electrical load factors comprise environmental factors. Further disclosed is a battery selector wherein the battery simulator comprises a vehicle simulation and performance analysis. Further disclosed is a battery selector further comprising a display, wherein the display shows the battery selection. Further disclosed is a battery selector wherein the driver factors comprise user input driver factors.

Further advantages and aspects can be understood from the details provided further herein.

It should be understood that the drawings are not necessarily to scale. In certain instances, details that are not necessary to the understanding to the invention or render other details difficult to perceive may have been omitted. It should be understood, of course, that the invention is not necessarily limited to the particular embodiments illustrated herein.

DETAILED DESCRIPTION

Turning to the Figures, a system and method is shown which helps to identify battery longevity and/or what battery may be best suited to a particular vehicle/driver/etc.

Figure 1:
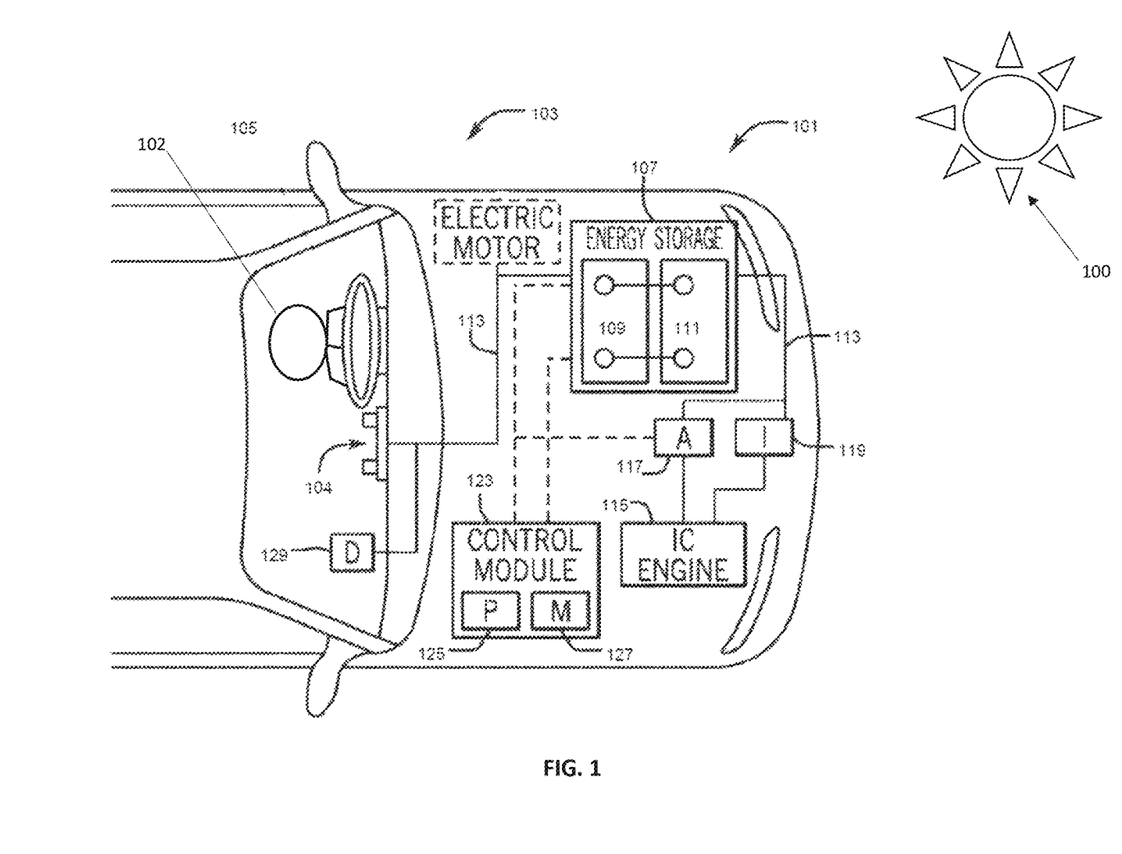
FIG. 1 is a diagram of a vehicle, according to various examples of embodiments.

The present disclosure may be understood to relate to (but not be limited to) use of a battery in a vehicle environment. In various embodiments, the battery may be a lithium ion or other advanced battery. FIG. 1 shows a cut-away of a vehicle 103 having a battery system 101 for electrical communication with the vehicle 103. The battery system 101 may include an energy storage component 107 which may comprise one or more battery modules (109, 111). The vehicle 103 may further comprise an engine 115, alternator 117, ignition system 119, and control module 123 which may have a processor 125 and memory 127. The energy storage component 107 may electrically couple to the vehicle's electrical system by way of a bus 113. This may allow for powering of vehicle functionality including electrical devices such as the vehicle display 129 and advanced vehicle functionality 105.

A vehicle electrical system may be included in an automotive vehicle 103 or the like. In some embodiments, the control system 123 may control operation of the battery system 101 and/or the electrical devices 104. For example, in an automotive vehicle 103, the control system 123 may include a battery management system (BMS) and/or a vehicle control unit (VCU).

Vehicle 103 may be understood to be operating within an environment 100. Further, an operator or driver 102 may be understood to operate the vehicle 103. Battery system 101 functionality may be understood to be influenced by vehicle 103 features (including, for example, vehicle functionality 105). Further, battery system 101 functionality (such as the support of vehicle requirements) may be influenced by environment 100 and driver 102 behaviors or usage patterns.

Figure 2:
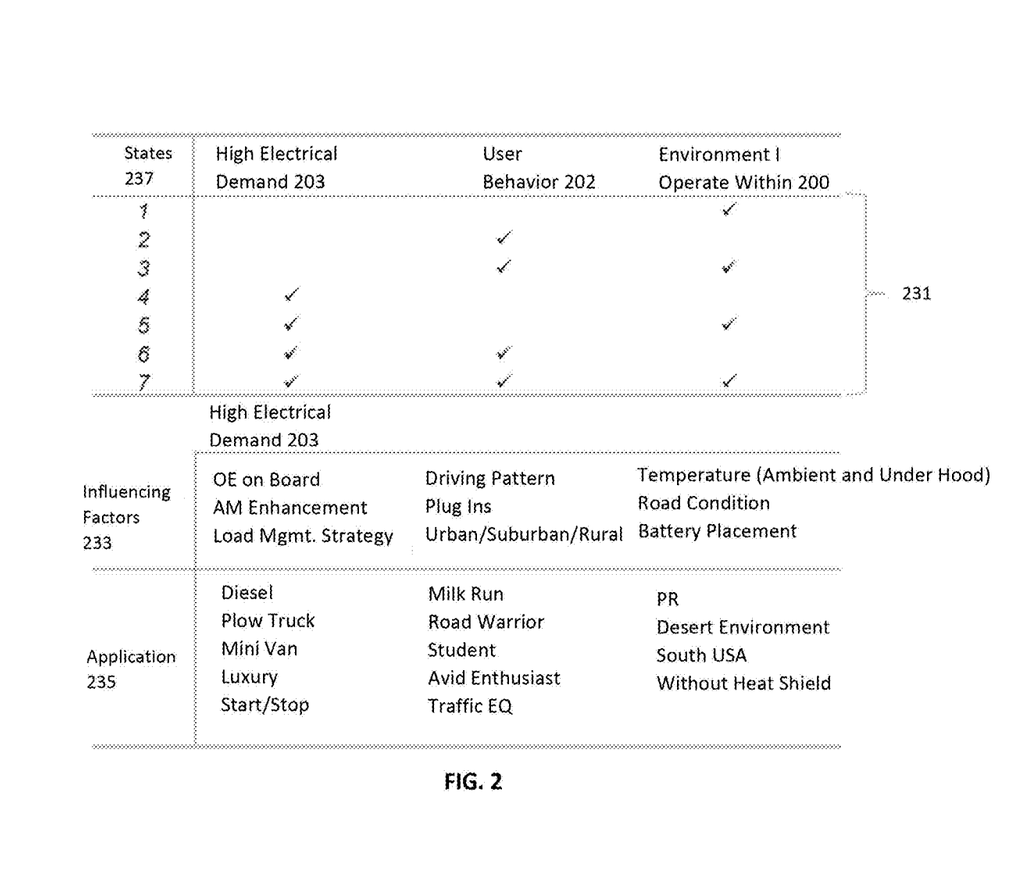
FIG. 2 is a diagram of a number of factors impacting battery longevity, according to various examples of embodiments.

FIG. 2 shows a number of tables 201 describing a number of different example non-limiting factors which may influence battery (for example, but not limited to, batteries 109 and 111) life or performance. As shown in FIG. 2, a number of factors can influence power requirements in a vehicle/demands on a battery. At an over-arching level, these factors may include high electrical demand (or electrical demands generally) 203, user behavior (driver factors) 202, and environment 200. Combinations of these factors or scenarios (for example, potential scenarios that lead to more capable technologies) may include a number of states 237. In various embodiments, states 237 may include only environment factors 200, only user behavior (driver) factors 202, combinations of environment 200 and user behavior (driver) 202 factors, electrical demand 203 only, electrical demand 203 and environment 200 factors combined, user behavior 202 and electrical demand 203 combined, or combinations of all three (electrical demand 203, user behavior 202 and environment 200).

Moving to the bottom half of FIG. 2, a number of influencing factors 233 and applications 235 are shown for the three factors (203, 202, 200) described above. For example, electrical demand (in various embodiments, high electrical demand) 203 may further comprise a number of influencing factors 233, such as functionalities built into the vehicle itself at production (ME on board), any automotive enhancements (AM enhancement), or other load management strategy situation. These features may find application 235 or may be relevant to particular vehicles such as diesel vehicles, plow trucks, minivans, luxury vehicles, and/or start/stop equipped vehicles.

Also as shown in FIG. 2, user behavior (driver factors) 202 may also impact demands on a battery (again for example, but not limited to, batteries 109 and 111). This may include influencing factors 233 such as driving patterns, any devices the user has plugged into the vehicle (plug ins), and whether the user is driving the vehicle in an urban/suburban/or rural setting (driver context). The application 235 or circumstances (for example but not limited to the application of the influencing factors) under which a driver would use the vehicle may be to get groceries (milk run), frequently drive long distances (road warrior), to school (student), as an avid vehicle enthusiast, or in traffic.

In addition, FIG. 2 also details environmental factors 200 ("environment I operate within") which may impact vehicle electrical loads and in turn battery performance over time. These factors 233 may include, but not be limited to, temperature (both ambient and temperature under the vehicle hood), road condition, and battery placement in the vehicle. In application, this may include pressure, desert environment, southern environment, and whether a heat shield is present.

Various impacts on electrical loads and battery usage such as, but not limited to, those outlined above may impact battery longevity. These and other features over time may assist in understanding battery longevity under these and other conditions.

Figure 3:
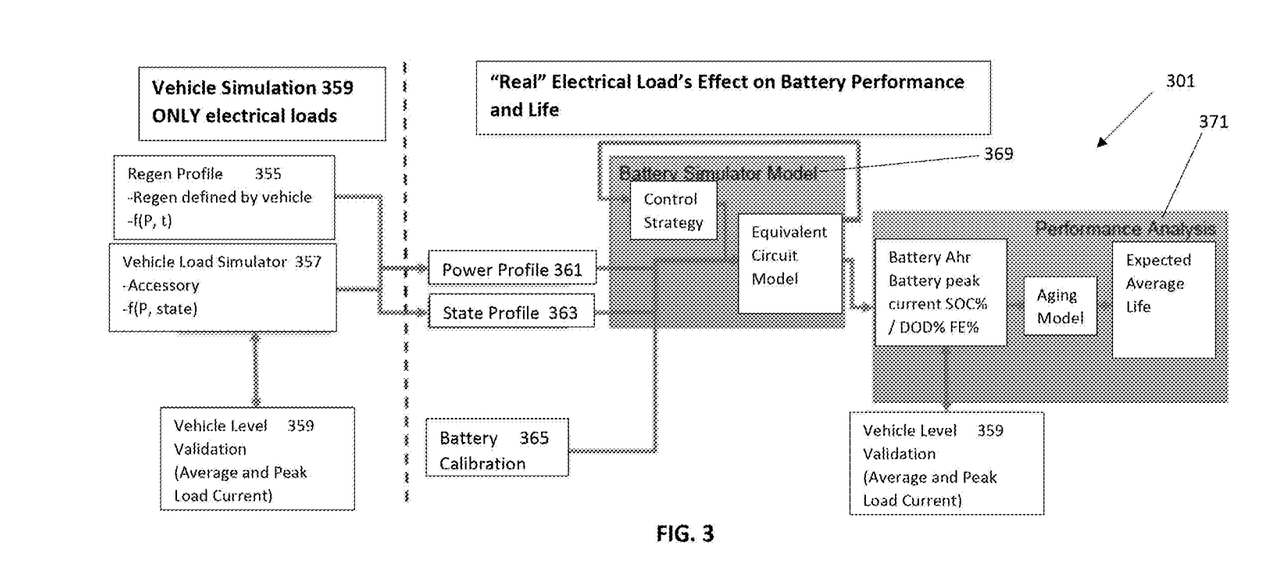
FIG. 3 shows a system and method for determining electrical load impact on battery performance according to various examples of embodiments.
Figure 7:
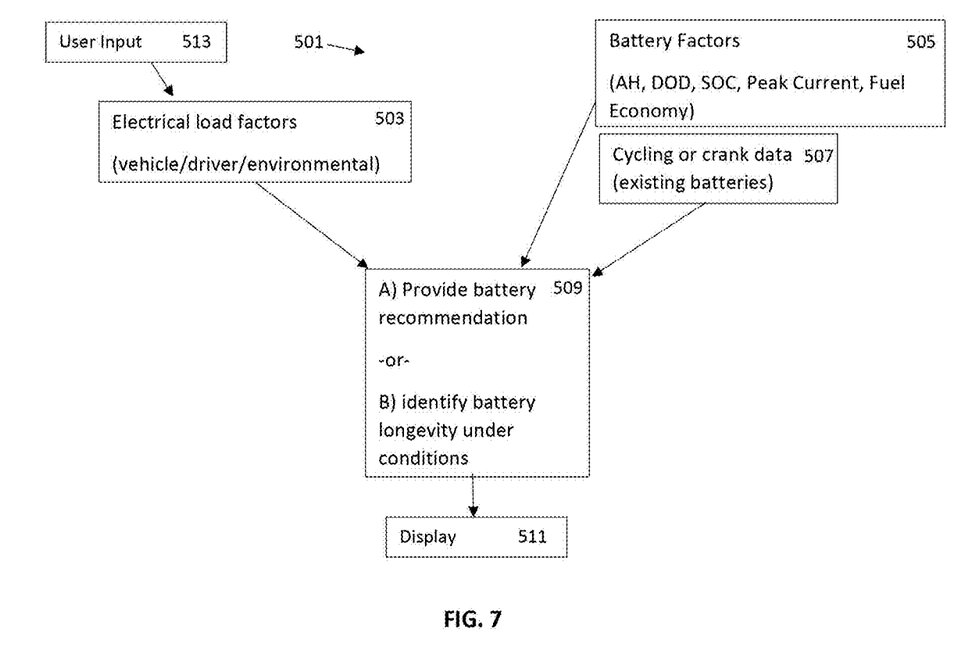
FIG. 7 shows a diagram of the system and method herein for battery selection relative to vehicle function.

FIG. 3 may be understood to illustrate a system of modeling impacts on battery longevity. In various embodiments, the system may comprise a vehicle simulation component 359 and "Real" Electrical Load component which may further comprise a battery simulator model 369 and performance analysis 371 portions. The system may be understood to comprise factors discussed more herein such as, but not limited to, battery factors, vehicle loads, and/or the plurality of cycling or crank data. Battery factors 505 (for example, as shown in FIG. 7) may comprise amperage hour throughput (Ah), depth of discharge (DOD), state of charge (SOC), peak current and battery contribution to fuel economy.

For example, in FIG. 3 a vehicle simulation 359 may initially be ran in order to gain preliminary insight into per-vehicle preliminary loads. Vehicle simulation 359 may comprise a regeneration power profile which may be defined by the vehicle as a function of time. Vehicle simulation 359 may also comprise a vehicle load simulator 357. Vehicle load simulator may comprise use of an accessory and/or consideration of vehicle accessories. Vehicle load simulator 357 may consider load as a function of time and vehicle state. Vehicle simulation may further comprise vehicle level validation 459. The vehicle simulation 359 may modify or be modified by the vehicle level validation 459. Vehicle level validation 459 may comprise average and peak load current.

Next, simulated or actual electrical loads from the vehicle may be used to evaluate effect on battery performance and life. Regeneration profile 355 and/or vehicle load simulator 357 may be seen to feed into a power profile 361 and/or state profile 363 of a vehicle. Further, battery calibration 365 data may be obtained. These data may be seen to feed into a battery simulator model 369. The battery simulator model may be seen to comprise a control strategy and equivalent circuit model. A battery simulator model 369 may be ran and performance analysis 371 may be evaluated. The battery performance analysis 371 may include battery ampere hours, battery peak state of charge, depth of discharge, and fuel economy. These may be compared with vehicle-level validation 459, which may include average and peak battery current. Standard aging for the battery may likewise be modeled. Finally, an expected life of a new battery under the conditions may be obtained in various embodiments. In various embodiments, the system and method may evaluate and output cycling life of a battery.

In FIG. 3, the battery simulator 369 and performance analysis 371 relationship can be seen for production of an expected life of a new battery. In various embodiments, the system may predict anticipated cycling life of a battery. Again, this may include incorporation of known battery aging models.

Figure 4:
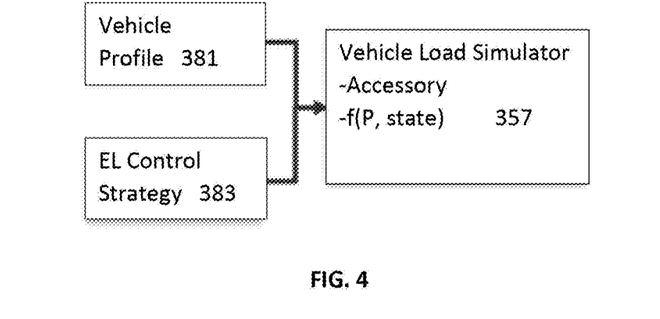
FIG. 4 is diagram of a vehicle load simulator for use with the system and method herein, according to various examples of embodiments.

In FIG. 4, more details regarding the vehicle load simulator 357 are provided. In various embodiments, a vehicle profile 381 and electrical load control strategy 383 may be combined to produce a vehicle load simulator 357. FIG. 4 shows some simplified factors which may impact the vehicle load simulator. As shown, the vehicle profile 381 and electrical control strategy 383 may be used in the vehicle load simulator 357.

The system and method may further comprise a system and method for obtaining estimates of vehicle load, which may, in various embodiments, be obtaining readings from an actual vehicle. Here again a number of scenarios may be present (vehicle type, season, time). Initial data and/or vehicle profiles may then be used. Next, the system may allow for selection of a number of drive simulations. The simulated loads may be based on known vehicle loads (see, e.g. FIG. 5).

Figure 5:
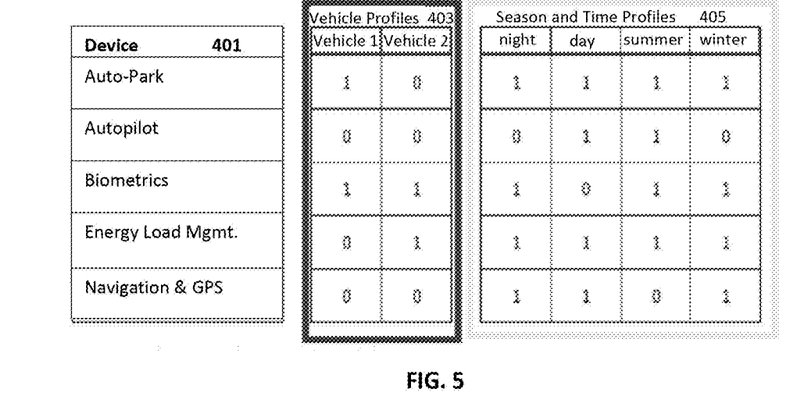
FIG. 5 shows a number of examples of electrical loads which may impact battery longevity, according to various examples of embodiments.

FIG. 5 shows a variety of electrical loads, including those associated with advanced battery functionality, may impact battery functionality and longevity within a vehicle. The electrical load may be understood as devices 401. Depending on the vehicle (vehicle profiles 403 which may likewise correlate to vehicle profiles 381), these electrical loads (for example, device(s) 401) may not be part of the vehicle function. For example, autopilot may not be part of vehicle 1 and vehicle 2, but may be part of vehicle 3. Load (Device 401) presence may also be dependent on season and/or time (for example, season and time profiles 405). For example, energy load management may be present in vehicle 2 during all seasons, whereas biometrics may be present in vehicle 1 or vehicle 2 in night, summer, or winter but not the day.

Figure 6:
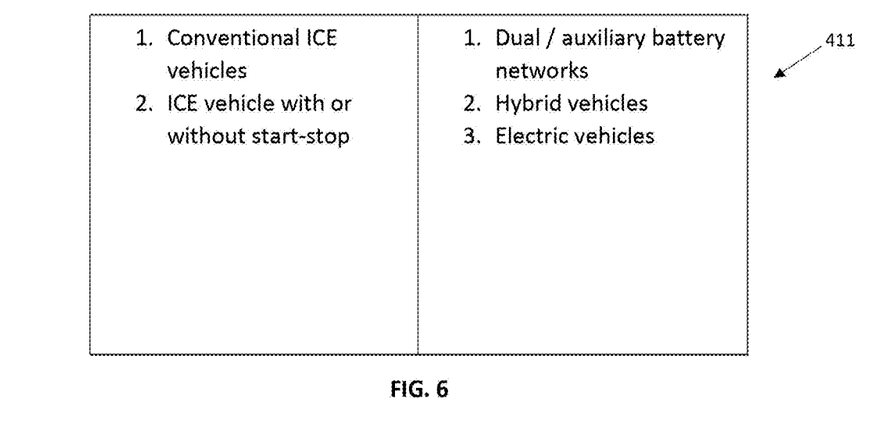
FIG. 6 shows a number of vehicle types for use with the system and method herein, according to various examples of embodiments.

A number of different vehicle types 411 are shown in FIG. 6. Each vehicle type may be usable (or optimally usable) with a particular type of battery under differing conditions. For example, conventional internal combustion engines (ICE) vehicles have different electrical requirements than, for example, ICE vehicles with start-stop functionality, vehicles with dual/auxiliary battery networks, hybrid vehicles. Some vehicles may have multiple batteries, for example, and start-stop only vehicles may have two batteries. Therefore, vehicle profile and/or electrical load control strategy (for example, 381, 383) may change based on the vehicle type 411.

FIG. 7 shows a summary or workflow of an example system and method herein 501, according to various examples of embodiments. A general repository of electrical load factors 503 may be consulted and an identification of particular needs based on factors such as vehicle, user characteristics (driver factors), and environment (environmental factors) may be made. In addition, information about battery types and functionality (battery factors 505) and cycling and/or crank data (for existing batteries) 507 may likewise be provided. In various embodiments, cranking may be considered a load. Then, based on these inputs, in various embodiments, the system may provide an output 509 such as a recommended battery or may provide feedback to a user regarding battery longevity under those particular conditions.

In various embodiments, the system and method herein may comprise one or more algorithms (for example, as shown in the Figures) comprising one or more software components and one or more computers. For example, the output 509 may be provided on a screen or interface while battery factors 505, cycling and/or crank data 507, and electrical load factors 503 may be provided in one or more databases or distributed systems. Further, information or factors such as, but not limited to, those provided in the Figures may be inputted or otherwise provide into one or more databases for access by the system and method herein. For example, in one or more non-limiting embodiments, simulators and analysis components (such as, but not limited to, 357, 369, 371, 509) may comprise software programs and components such as profiles (for example but not limited to 355, 361, 363, 503, 505, 507) may comprise certain data.

The system and method herein may be provided in various settings. For example, system and method herein may allow for an output 509 or interface at a point of sale or as part of business management or operation tools (such as, but not limited to, in inventory management, inventory planning, etc.). In various embodiments, output 509 may comprise a display 511. In various embodiments, users may provide certain data (user input 513), for example, as driver information as part of electrical load factors 503 in FIG. 7. This may be understood to comprise, for example, but not limited to, factors such as user behavior (driver factors) 202, environment factors 200, or electrical demand 203 factors as seen in FIG. 2. This and other information may allow for an output 509 such as a recommended battery. For example, the output 509 may be a screen or display 511 in a variety of contexts. For example, the display 511 could be provided at a point of sale (recommending a battery for user purchase, as a non-limiting example), in warehouse (for inventory management, as a non-limiting example), in a business management context (such as but not limited to inventory planning), or other context (such as but not limited to warranty planning). In various embodiments, the display 511 may comprise a user interface or further mechanism for accepting user input 513. This may comprise, for example, a display 509 on a mobile device having a touchscreen for user input 513 (while mobile device is provided, one or more computers having a suitable input mechanism generally should be contemplated as within the scope of the invention). It should be understood the foregoing are non-limiting examples of contexts and use cases which may advantageously be used with the system and method herein and further advantages and applications may be understood by those in the field. The system and method herein should be understood to provide advantages in a variety of contexts including but not limited to in both aftermarket and OEM settings.

Figure 8:
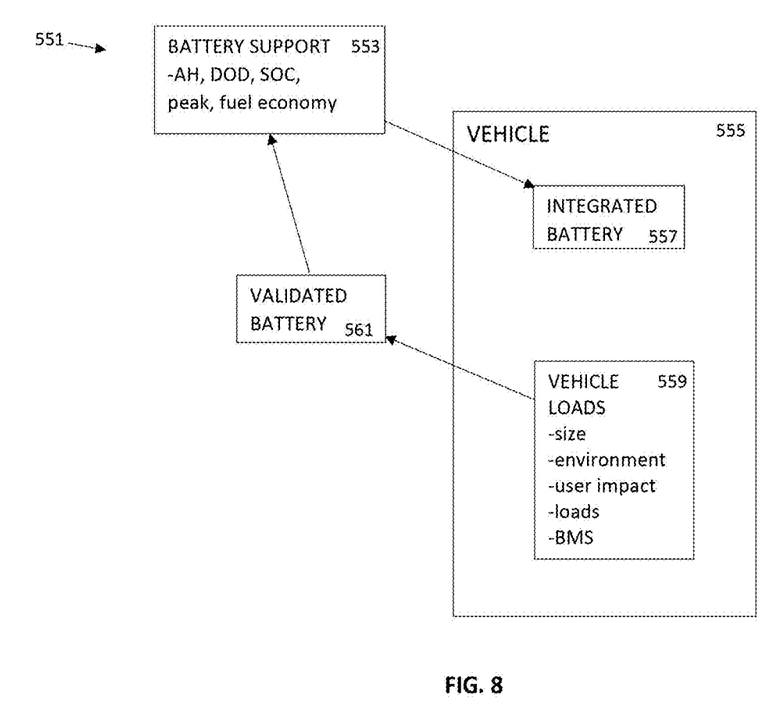
FIG. 8 shows a workflow for use of the system and method herein, according to various examples of embodiments.

FIG. 8 shows another system 551 for use with the system and method herein, according to various examples of embodiments. A vehicle 555 having a vehicle system including the system and method herein according to various examples of embodiments may be seen. The vehicle 555 may have a number of vehicle loads 559. The vehicle loads 559 may comprise consideration of environmental factors (for example, temperature and humidity may impact battery functionality) as well as consideration of user factors (routine highway driving, etc.). Further, the vehicle loads 559 may also comprise size, user impact, loads, and battery management system. A load profile may be understood to comprise the vehicle loads 559. Next, the load profile (vehicle loads 559) may be used to select a group of batteries (validated batteries) 561 which may be known to support the load profile. Next, the system provides for battery support 553 attributes. These attributes may include particular vehicle load support advantages including Amp-hr throughput over time, average and peak current over time, and SOC (state of charge), and DOD (depth of discharge) curves over time. Fuel economy may likewise be considered. A battery from the validated battery group may be selected for integration into the vehicle (which may be understood as a battery selected for its ability to support the identified loads) as an integrated battery 557 based on battery support attributes, in various embodiments. For example, some electrical loads would better fit an AGM battery versus an EFB battery. Certain batteries will have performance characteristics (for example Amp-hr throughput over time, average and peak current over time, and SOC (state of charge)/DOD (depth of discharge) curves over time) than others. Therefore, the integrated battery 557 may comprise a fit between the battery functionality (Battery Support) and vehicle/scenario requirements (vehicle loads or load profile). In various embodiments, the integrated battery 557 may allow for improved support of cranking or cycling than another battery. Further, in various embodiments, the integrated battery 557 may allow for a smaller battery use with the vehicle. By decreasing battery size, vehicle weight and performance may be improved.

Further, the system and method herein may allow for improvements to the battery recommendation or longevity estimate. For example, as further data is collected (for example, but not limited to, electrical load factors or data 203, user behavior factors or data 202, and/or environmental factors or data 200, etc.) the results may lead to updates and improved predictions through their use in the system and method herein. In addition, the system and method herein may update the battery recommendation based on updates to battery technology or the field of known batteries.

In various embodiments, the selection criteria to provide a battery recommendation may be generated from one or more quantitative outputs from one or more models as shown in the Figures. The model outputs may include, but are not limited to, Amp-hr throughput over time, average and peak current over time, and SOC (state of charge)/DOD (depth of discharge) curves over time, and fuel economy. This may be correlated, for example, but not limited to, as battery factors 505 and/or battery support 553.

Multiple objectives may be achieved with the outputs and/or system and method herein:
(1) Performance pairing of one or more batteries, for example, but not limited to, based off of A-hr Throughput, Average and Peak Power/Current, and the SOC (State of Charge)/DOD (Depth of Discharge), of the battery, for example, all over time
(2) Warranty & Expected Remaining Life of one or more batteries, for example, but not limited to, based off the DOD (depth of discharge)
(3) A recommended battery pairing may be selected based off these and other outputs compared among various technologies, group sizes, and usage cases.

The system and method herein may advantageously allow for improved fit between battery and battery usage (vehicle, use case-including user behaviors and environment as disclosed herein, etc.). This may provide advantages in both OEM and aftermarket scenarios for selection of a suitable battery.

In various embodiments, the disclosed system and method may provide a battery recommendation based off the intended usage case, electrical loads, as well as environmental factors of the vehicle. This recommendation may therefore advantageously be backed by quantitative data outputted by a model where selection criteria may then be in place to select an optimum battery or identify battery longevity. The system may be used in new vehicles (OEM setting) or in used vehicles (for example, in replacement batteries). In addition the disclosed system and method may be used in a single vehicle or in a group of vehicles—for example Zip Code ViO (Vehicle in Operation) Analysis (for IAM) or "All SUVs" (for an OE).

The system and method herein may allow for improved predictions of battery longevity for warranty purposes and battery performance characteristics. The system may also allow for comparison of battery performance, for example, among a range of battery technologies, product lines (including for example manufacturers, plants), and group sizes. The system may also be able to provide battery recommendations and battery longevity predictions across different usage cases and control strategy (for example, but not limited to, vehicle management of alternator and battery) cases and their effect on the life of a particular battery (for example, across use cases or driver behavior such as Soccer Mom vs. Traveling Salesman vs. Off-Road Driver).

In other words, the disclosed system and method herein may have a number of outputs. One may recommend a particular battery given the battery characteristics and requirements of the situation (e.g. vehicle, environment, operator, etc.). Another may predict the lifespan of using the recommended battery (for example but not limited to, for warranty purposes). Finally, the system and method herein may be used to predict longevity of an existing battery within the vehicle. These three uses or outputs are non-limiting examples; other uses and outputs may be understood as within the scope of this disclosure.

It should be noted that references to relative positions (e.g., "top" and "bottom" or "first" and "second") in this description are merely used to identify various elements as are oriented in the Figures. It should be recognized that the orientation of particular components may vary greatly depending on the application in which they are used.

For the purpose of this disclosure, the term "coupled" means the joining of two members directly or indirectly to one another. Such joining may be stationary in nature or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It is also important to note that the construction and arrangement of the system, methods, and devices as shown in the various examples of embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements show as multiple parts may be integrally formed, the operation of the interfaces may be reversed or otherwise varied, the length or width of the structures and/or members or connector or other elements of the system may be varied, the nature or number of adjustment positions provided between the elements may be varied (e.g. by variations in the number of engagement slots or size of the engagement slots or type of engagement). The order or sequence of any algorithm, process, or method steps may be varied or re-sequenced according to alternative embodiments. Likewise, some algorithm or method steps described may be omitted, and/or other steps added. Other substitutions, modifications, changes and omissions may be made in the design, operating conditions and arrangement of the various examples of embodiments without departing from the spirit or scope of the present inventions.

While this invention has been described in conjunction with the examples of embodiments outlined above, various alternatives, modifications, variations, improvements and/or substantial equivalents, whether known or that are or may be presently foreseen, may become apparent to those having at least ordinary skill in the art. Accordingly, the examples of embodiments of the invention, as set forth above, are intended to be illustrative, not limiting. Various changes may be made without departing from the spirit or scope of the invention. Therefore, the invention is intended to embrace all known or earlier developed alternatives, modifications, variations, improvements and/or substantial equivalents.

The technical effects and technical problems in the specification are exemplary and are not limiting. It should be noted that the embodiments described in the specification may have other technical effects and can solve other technical problems.

Aspects of the method described herein are implemented on a software system running on a computer system. To this end, the methods and system may be implemented in, or in association with, a general-purpose software package or a specific purpose software package. As a specific, non-limiting example, the device could be a battery and/or vehicle in communication with a cloud storage database and/or mobile device. As another specific, non-limiting example, the device could be a mobile device in communication with a cloud storage database.

The software system described herein may include a mixture of different source codes. The system or method herein may be operated by computer-executable instructions, such as but not limited to, program modules, executable on a computer. Examples of program modules include, but are not limited to, routines, programs, objects, components, data structures, and the like which perform particular tasks or implement particular instructions. The software system may also be operable for supporting the transfer of information within a network.

While the descriptions may include specific devices or computers, it should be understood the system and/or method may be implemented by any suitable device (or devices) having suitable computational means. This may include programmable special purpose computers or general-purpose computers that execute the system according to the relevant instructions. The computer system or portable electronic device can be an embedded system, a personal computer, notebook computer, server computer, mainframe, networked computer, workstation, handheld computer, as well as now known or future developed mobile devices, such as for example, a personal digital assistant, cell phone, smartphone, tablet computer, mobile scanning device, and the like. Other computer system configurations are also contemplated for use with the communication system including, but not limited to, multiprocessor systems, microprocessor-based or programmable electronics, network personal computers, minicomputers, smart watches, and the like. Preferably, the computing system chosen includes a processor suitable for efficient operation of one or more of the various systems or functions or attributes of the communication system described.

The system or portions thereof may also be linked to a distributed computing environment, where tasks are performed by remote processing devices that are linked through a communication network(s). To this end, the system may be configured or linked to multiple computers in a network including, but not limited to, a local area network, wide area network, wireless network, and the Internet. Therefore, information, content, and data may be transferred within the network or system by wireless means, by hardwire connection, or combinations thereof. Accordingly, the devices described herein communicate according to now known or future developed pathways including, but not limited to, wired, wireless, and fiber-optic channels.

In one or more examples of embodiments, data may be stored remotely (and retrieved by the application) or may be stored locally on a user's device in a suitable storage medium. Data storage may be in volatile or non-volatile memory. Data may be stored in appropriate computer-readable medium including read-only memory, random-access memory, CD-ROM. CD-R, CD-RW, magnetic tapes, flash drives, as well as other optical data storage devices. Data may be stored and transmitted by and within the system in any suitable form. Any source code or other language suitable for accomplishing the desired functions described herein may be acceptable for use.

Furthermore, the computer or computers or portable electronic devices may be operatively or functionally connected to one or more mass storage devices, such as but not limited to, a hosted database or cloud-based storage.

The system may also include computer-readable media which may include any computer-readable media or medium that may be used to carry or store desired program code that may be accessed by a computer. The invention can also be embodied as computer-readable code on a computer-readable medium. To this end, the computer-readable medium may be any data storage device that can store data. The computer-readable medium can also be distributed over a network-coupled computer system so that the computer-readable code is stored and executed in a distributed fashion.

What is claimed is:

1. A battery simulator for use with a vehicle having a vehicle control module, the battery simulator comprising:
    a data input receiving data from the vehicle control module, the data including:
        a plurality of battery factors including amperage hour throughput, depth of discharge, state of charge, peak current, and battery contribution to fuel economy;
        a plurality of electrical load factors including driver factors and environmental factors, wherein the driver factors include driving patterns and driving context and wherein the environmental factors include ambient temperature, under vehicle hood temperature, humidity, road condition, and battery placement in vehicle; and
        a plurality of cycling or crank data;
    a processor, and
    a memory operatively connected to the processor, the memory storing instructions that, when executed by the processor, cause the processor to use the plurality of battery factors, plurality of electrical load factors, and the plurality of cycling or crank data to create a vehicle simulation and performance analysis of the battery, and provide an output based on the vehicle simulation and performance analysis, the output comprising a battery recommendation or feedback to a user regarding battery longevity.

2. The battery simulator of claim 1, comprising a plurality of influencing factors comprising vehicle data, automotive enhancements, and load management strategy used by the battery simulator.

3. The battery simulator of claim 2, wherein the vehicle data includes vehicle type.

4. The battery simulator of claim 2, wherein the load management strategy is a load profile comprising a vehicle load including size, user impact, load, and battery management system.

5. The battery simulator of claim 1, wherein the plurality of electrical load factors is obtained from a general repository of electrical load factors.

6. The battery simulator of claim 1, wherein the output is delivered at an interface at a point of sale or operational tool.

7. The battery simulator of claim 6, wherein the interface is a display.

8. The battery simulator of claim 6, wherein the operational tool is a business management tool for warranty planning.

9. A vehicle comprising:
    a system having a number of loads defining a load profile;
    a validated battery group comprising one or more batteries which can fulfill the load profile;
    an integrated battery selected from the validated battery group, the integrated battery selected for longevity relative to other batteries; and
    the integrated battery is provided for use with the vehicle.

10. The vehicle of claim 9, wherein the load profile comprises battery factors including amperage hour throughput, depth of discharge, state of charge, peak current, battery size, and battery contribution to fuel economy.

11. The vehicle of claim 9, wherein the load profile comprises environmental factors including ambient temperature, under vehicle hood temperature, humidity, road condition, and battery placement in vehicle.

12. The vehicle of claim 9, wherein the load profile comprises driver factors including driving patterns and driving context.

13. The vehicle of claim 9, wherein the load profile comprises vehicle loads including vehicle display, auto-park, autopilot, biometrics, navigation or global positioning system (GPS), and electrical devices.

14. A battery selector comprising:
    a plurality of battery factors;
    a plurality of electrical load factors comprising electrical demand factors, driver factors, and environmental factors, wherein the driver factors include driving patterns and driving context and wherein the environmental factors include ambient temperature, under vehicle hood temperature, humidity, road condition, and battery placement in vehicle;
    a plurality of cycling or crank data;
    a display;
    a processor, and
    a memory operatively connected to the processor, the memory storing instructions that, when executed by the processor, cause the processor to provide an output on the display, the output comprising a battery selection based on the plurality of battery factors, plurality of electrical load factors, and the plurality of cycling or crank data.

15. The battery selector of claim 14, further comprising a battery simulator having the plurality of battery factors, the plurality of electrical load factors, and/or the plurality of cycling or crank data.

16. The battery selector of claim 15, wherein the battery simulator is configured to use the plurality of battery factors, the plurality of electrical load factors, and the plurality of cycling or crank data to create a vehicle simulation and performance analysis of the battery and wherein the battery selection is further based on the vehicle simulation and performance analysis.

17. The battery selector of claim 14, wherein the electrical load factors comprise electrical demand influencing factors.

18. The battery selector of claim 14, wherein the driver factors include driver influencing factors.

19. The battery selector of claim 14, wherein the plurality of electrical load factors includes an application obtained based on a user input.

20. A battery selector comprising:
    a battery simulator having:
        a plurality of battery factors, wherein the battery factors comprise amperage hour throughput, depth of discharge, state of charge, peak current and/or battery contribution to fuel economy;

a plurality of electrical load factors, wherein the electrical load factors comprise driver factors and environmental factors, wherein the driver factors comprise driving patterns and driving context and wherein the environmental factors include ambient temperature, under vehicle hood temperature, humidity, road condition, and battery placement in vehicle; and a plurality of cycling or crank data;

a display, a processor, and a memory operatively connected to the processor, the memory storing instructions that, when executed by the processor, cause the processor to use the plurality of battery factors, the plurality of electrical load factors, and the plurality of cycling or crank data to create a vehicle simulation and performance analysis of the battery, and provide an output on the display, the output based on the vehicle simulation and performance analysis, the output comprising a battery recommendation or feedback to a user regarding battery longevity.

21. The battery selector of claim 20, comprising a plurality of influencing factors comprising vehicle data, automotive enhancements, and load management strategy used by the battery simulator.

22. The battery selector of claim 21, wherein the vehicle data includes vehicle type.

23. The battery selector of claim 21, wherein the load management strategy is a load profile comprising a vehicle load, including size, user impact, load, and battery management system.

24. The battery selector of claim 20, wherein plurality of electrical load factors is obtained from a general repository of electrical load factors.

25. The battery selector of claim 20, wherein the output is delivered at an interface at a point of sale or operational tool.

26. The battery selector of claim 25, wherein the operational tool is a business management tool for warranty planning.

27. The battery selector of claim 20, further comprising a battery group, wherein the output includes one or more validated batteries selected from the battery group.

28. The battery selector of claim 27, wherein the battery selector selects an integrated battery for use in a system from the one or more validated batteries.

29. A battery selector comprising:

a battery simulator for use with a vehicle having a vehicle control module, the battery simulator comprising:

a data input receiving data from the vehicle control module, the data including:

a plurality of battery factors including amperage hour throughput depth of discharge, state of charge, peak current, and battery contribution to fuel economy;

a plurality of electrical load factors including driver factors and environmental factors, wherein the driver factors include driving patterns and driving context and wherein the environmental factors include ambient temperature, under vehicle hood temperature, humidity, road condition, and battery placement in vehicle; and a plurality of cycling or crank data;

a process; and a memory operatively connected to the processor, the memory storing instructions that, when executed by the processor, cause the processor to use the plurality of battery factors, plurality of electrical load factors, and the plurality of cycling or crank data to create a vehicle simulation and performance analysis of the battery, and provide an output based on the vehicle simulation and performance analysis, the output comprising a battery recommendation or feedback to a user regarding battery longevity; and wherein the battery selector is configured to select a battery from a battery group based on the output of the battery simulator.

30. A battery longevity predictor comprising:

a battery simulator for use with a vehicle having a vehicle control module, the battery simulator comprising:

a data input receiving data from the vehicle control module, the data including:

a plurality of battery factors including amperage hour throughput, depth of discharge, state of charge, peak current, and battery contribution to fuel economy;

a plurality of electrical load factors including driver factors and environmental factors, wherein the driver factors include driving patterns and driving context and wherein the environmental factors include ambient temperature, under vehicle hood temperature, humidity, road condition, and battery placement in vehicle; and a plurality of cycling or crank data;

a processor; and a memory operatively connected to the processor, the memory storing instructions that, when executed by the processor, cause the processor to use the plurality of battery factors, plurality of electrical load factors, and the plurality of cycling or crank data to create a vehicle simulation and performance analysis of the battery, and provide an output based on the vehicle simulation and performance analysis, the output comprising a battery recommendation or feedback to a user regarding battery longevity; and wherein the battery longevity predictor is configured to provide a longevity prediction based on the output of the battery simulator.

* * * * *